United States Patent [19]

Sato et al.

[11] Patent Number: 4,930,439
[45] Date of Patent: Jun. 5, 1990

[54] MASK-REPAIRING DEVICE

[75] Inventors: Mitsuyoshi Sato; Takashi Kaito; Yoshitomo Nakagawa, all of Tokyo, Japan

[73] Assignee: Seiko Instruments Inc., Japan

[21] Appl. No.: 227,469

[22] Filed: Aug. 2, 1988

Related U.S. Application Data

[63] Continuation of Ser. No. 845,135, filed as PCT JP85/00349 on Jun. 21, 1985, published as WO86/00426 on Jun. 16, 1986, abandoned.

[30] Foreign Application Priority Data

Jun. 26, 1984 [JP] Japan .................................. 59-131720
Nov. 5, 1984 [JP] Japan .................................. 59-232853
Nov. 13, 1984 [JP] Japan .................................. 59-171789

[51] Int. Cl.$^5$ ............................................. C23C 16/04
[52] U.S. Cl. .................................... 118/723; 118/722; 118/50.1; 427/43.1; 427/35; 250/398; 250/492.3; 239/584
[58] Field of Search ...................... 118/50.1, 620, 722, 118/723, 715; 427/43.1, 44, 140, 35, 36; 250/492.21, 423 F, 398; 239/584

[56] References Cited

U.S. PATENT DOCUMENTS 177,051 9/1930 Scott ................................ 239/584 X
1,347,994 7/1920 Day ..................................... 118/707

(List continued on next page.)

FOREIGN PATENT DOCUMENTS 53-135276 11/1978 Japan .
55-111132 8/1980 Japan .
55-150226 11/1980 Japan .
58-6133 1/1983 Japan .
60-52022 3/1985 Japan .
60-94728 5/1985 Japan .
594024 10/1947 United Kingdom ................ 118/300
2035500 8/1980 United Kingdom .

OTHER PUBLICATIONS

Olander et al.; "Molecular Beam Sources Fabricated from Multichannel Arrays. III. The Exit Density Problem"; Journal of Applied Physics, vol. 41, No. 7, Jun. 1970; pp. 2769-2776.

Matsui et al.; "New Selective Deposition Technology by Electron Beam Induced Surface Reactron"; The 15th Symposium on Ion Implantation and Submicron Fabrication (Feb. 1-3, 1984); pp. 121-124.

"New Course 2 of Experimental Chemistry"; Published by Maruzen; pp. 371-379; with english translation.

Extended Abstracts of 16th International Converence on Solid State Devices and Materials, Aug. 30-Sep. 1, 1984, pp. 31-34.

Japanese Journal of Applied Physics, vol. 23, No. 5, May 1984, pp. L293-295, article "Ion Beam Assisted Deposition of Metal Organic Films Using Focused Ion Beam" by K. Gamo et al.

Nuclear Instruments and Methods, vol. 182/183 (1981), pp. 297-302, article "Carbon Buildup By Ion-Induced Polymerization Under 100-400 keV H,He and Li Bombardment" by W. Moller et al.

Primary Examiner—Shrive Beck
Assistant Examiner—Alain Bashore
Attorney, Agent, or Firm—Bruce L. Adams; Van C. Wilks

[57] ABSTRACT

An apparatus for treating a sample comprises an ion source for irradiating a designated area of the sample with a focused ion beam, a vessel for storing compound to be vaporized, a heater surrounding the vessel for heating the compound to vaporize the same inside the vessel to produce compound vapor, and a nozzle for directing the compound vapor in the form of a vapor stream onto the designated area of the sample being irradiated with the focused ion beam. A valve is disposed along the fluid communication path between the vessel and the nozzle and has a closed state for blocking the flow of compound vapor through the nozzle and an open state for permitting the flow of compound vapor through the nozzle. The apparatus can be used to form pattern films on substrates, to repair defects in photomasks and X-ray masks, and to cut or connect wiring in integrated circuits.

19 Claims, 4 Drawing Sheets

U.S. PATENT DOCUMENTS

| | | | |
|---|---|---|---|
| 2,090,232 | 8/1937 | Ritz | 239/584 X |
| 2,639,193 | 5/1953 | Wood, Jr. | 239/584 X |
| 2,639,365 | 5/1953 | Krampe et al. | 219/271 |
| 3,117,022 | 9/1960 | Bronson et al. | 118/715 X |
| 3,364,087 | 1/1968 | Solomon et al. | 430/297 X |
| 3,516,855 | 6/1970 | Goll et al. | 118/723 X |
| 3,547,683 | 12/1970 | Williams et al. | 117/93.31 |
| 3,628,014 | 12/1971 | Grubic | 250/49.5 A |
| 3,772,520 | 11/1973 | Varker | 250/307 |
| 3,801,366 | 4/1974 | Lemelson | 427/43.1 X |
| 3,851,146 | 11/1974 | Bennett | 239/136 X |
| 3,930,155 | 12/1975 | Kanomata et al. | 250/309 |
| 3,949,106 | 4/1976 | Araki et al. | 427/249 |
| 4,041,311 | 8/1977 | Martin | 250/311 |
| 4,042,066 | 8/1977 | Engl et al. | 427/43.1 X |
| 4,219,731 | 8/1980 | Migitaka et al. | 250/310 |
| 4,260,873 | 4/1981 | Simmonds | 239/136 X |
| 4,266,116 | 5/1981 | Bauer et al. | 219/275 X |
| 4,357,364 | 11/1982 | Jones | 427/43.1 |
| 4,405,435 | 9/1983 | Tateishi et al. | 118/719 X |
| 4,457,803 | 7/1984 | Takigawa | 156/626 |
| 4,460,436 | 7/1984 | Hiraoka | 427/43.1 X |
| 4,480,172 | 10/1984 | Ciciliot et al. | 239/136 X |
| 4,488,506 | 12/1984 | Heinecke et al. | 118/719 X |
| 4,503,329 | 3/1985 | Yamaguchi et al. | 250/309 |
| 4,557,685 | 12/1985 | Gellert | 239/132 |
| 4,560,872 | 12/1985 | Antonovsky | 250/310 |
| 4,605,566 | 8/1986 | Matsui et al. | 427/43.1 |
| 4,609,566 | 9/1986 | Hongo et al. | 118/50.1 |
| 4,698,236 | 10/1987 | Kellogg et al. | 427/43.1 |

MASK-REPAIRING DEVICE

This is a continuation of application Ser. No. 845,135, filed as PCT TP85/00349 on Jun. 21, 1985, published as WO86/00426 on Jan. 16, 1986, now abandoned.

FIELD OF TECHNOLOGY

The present invention relates to a mask-repairing device for use in repairing defects, such as an insufficiently formed film, or an unwanted excessively formed film, in masks utilized in semiconductor manufacturing, or for use in repairing disconnected or unconnected wiring, and short-circuit patterns, of the semiconductor device itself.

BACKGROUND TECHNOLOGY

A method of forming a pattern film at a target position by discharging an ion beam to a predetermined position on the sample in an atmosphere where compound vapor exists, in presently receiving attention as a repairing method for semiconductors and masks. As a method to supply the compound vapor to the target position on the sample, the Knudsen cell method described in "New Course 2 of Experimental Chemistry" published by Maruzen, Nov. 20, 1978, pages 371 to 379, is being utilized. As shown in FIG. 4, a Knudsen cell 52, in which compound 51 is stored inside, is heated by heater 53 provided on the outer circumferential portion, and the compound evaporated by the heating is ejected through an orifice 54. As shown, a thermo couple 55 is provided on the Knudsen cell 52 so that it is possible to control the heating temperature with a temperature controller, and to control the ejection amount of the compound vapor.

Also, as a similar method to form a pattern film utilizing the reaction between a charged particle beam and a chemical compound, the following method has been proposed in the draft manuscript of a lecture on "The Injection of Ions and the Processing of Submicrons" of the 15th symposium held in the Physico Chemical Research Institute. In this method, which is described in FIG. 5, the compound vapor 56 is supplied to a sub-sample chamber 58 provided within a sample chamber 57, and then an electron beam 60 discharged from an electron gun 59 is applied to the sample 56 through a small bore 61 provided in sub-sample chamber 58.

In the method described in FIG. 4, the compound vapor ejected from the orifice 54 fans out and spreads in a broad area without any directional characteristics. In general, the region to which the charged particle beam is applied to form the pattern film is smaller than $1 \times 1$ mm. Therefore, the compound vapor directed to anywhere beyond the target position is wasted, and causes various disadvantages. For example, when the compound adheres to undesired areas, the quantity of compound vapor supplied to the intended area at which the pattern film is to be formed may change as time passes, or when a charged particle beam such as an ion beam is utilized, it may cause deterioration of the series (for example, the life span of the ion source is reduced), as the compound adheres to the charged particle beam series.

Also, in the method described in FIG. 5, as it utilizes a sub-sample chamber inside the sample chamber, the driving mechanism for positioning the sample is complicated, and it is difficult to detect the defects of the mask. Furthermore, the following three mechanisms are required for a mask-repairing device that utilizes ion beam: a defect repairing mechanism which forms a thin film by the reaction between the compound vapor and the ion beam; a defect repairing mechanism which removes an unnecessary thin film by ion beam sputtering; and a sample surface detecting mechanism which utilizes secondary charged particles. Therefore, at the time of repairing an insufficiently formed film, the compound vapor is guided into the sub-sample chamber, but at the time of removing an unwanted portion of a formed film, the partial pressure of the vapor inside the sub-sample chamber must be sufficiently low to enable effective sputtering. Consequently, the mask-repairing device utilizing the sub-sample chamber has the disadvantage that it takes to much time in controlling the ON-OFF condition of the compound vapor.

The present invention has been devised to solve the above problems, and one object of the invention is to provide a mask-repairing device that easily controls the ON-OFF conditions of the ejection of the compound vapor by applying the vapor directionally without polluting unnecessary areas.

Also, another object of the present invention is to provide a mask-repairing device that can form a thin film not only on a flat portion of the sample but also on a recessed portion of the sample which is adjacent to the pattern, with the same conditions.

Furthermore, another object of the present invention is to provide a mask-repairing device that reduces the ejection amount of the compound vapor to prevent the inside of the sample chamber from being polluted and to prolong the life span of the ion source.

Further still, an object of the present invention is to provide a mask-repairing device where, by providing an interlock circuit, the contact between the nozzle tip and the sample palette guard is prevented, and the reliability of the device is improved.

SUMMARY OF THE INVENTION

The mask-repairing device of the present invention is comprised of a compound vessel which evaporates the compound, a thin tube-like nozzle connected to the compound vessel, and a valve body which turns the connection between the compound vessel and the nozzle in an open or closed condition so as to apply compound vapor directionally, without polluting unnecessary areas, and to control the ON-OFF conditions of the ejection of the compound.

Also, the mask-repairing device of the present invention can form a thin film on a flat portion and also on a recessed portion adjacent to the pattern, with the same conditions, by arranging several compound vapor ejecting nozzles around the fixed ion beam emitting position.

Furthermore, the mask-repairing device of the present invention optionally enables the backward and forward movements of the compound vapor-ejecting nozzle, and, by bringing the tip of the nozzle close to desired position, the ejection amount of the compound vapor is reduced, pollution inside the sample chamber is prevented, and thus the life span of the ion source is prolonged.

Further still, by providing an inter-lock circuit which enables the opening and closing of the gate valve between the driving of the sample base and the sub-sample chamber only when the tip of the vapor-ejecting nozzle is moved backwardly from the fixed position, the contact between the nozzle tip and the sample palette guard can be prevented.

DETAILED DESCRIPTION OF THE INVENTION

Figure 1:
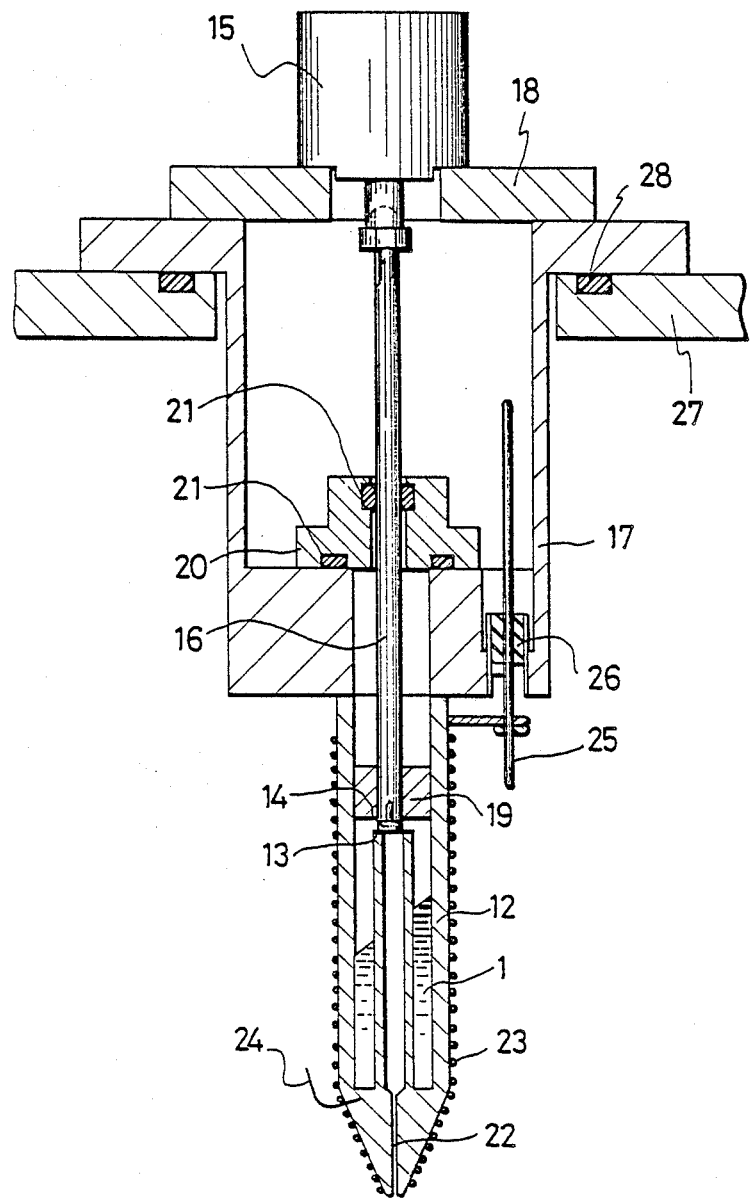
FIG. 1 is a sectional diagram showing the compound vapor ejection device according to one embodiment of the present invention.

An explanation of the present invention will now be given referring to the drawings.

Embodiment 1

FIG. 1 is a main sectional diagram of embodiment 1. Referring to FIG. 1, compound vessel 12 stores compound 1 inside. A valve body is disposed within the vessel 12 and comprises a guide tube 13 which defines a compound vapor guide hole 13' and a plunger 14 for opening and closing the hole 13'. The compound vapor guide hole 13' communicates at its lower end with a nozzle 22. As shown in FIG. 1, when the plunger 14 seats tightly on the guide tube 13 to close the compound vapor guide hole 13', the valve body is in a closed condition, and when the plunger 14 moves axially upwardly to open the hole 13' so that a gap occurs between the plunger 14 and the end surface of the guide tube 13, the valve body is in an open condition. The movement of the plunger 14 is conducted by a cylinder 15 through a rod 16, the cylinder 15 being retained by a cylinder mounting board 18. A valve bearing 19 guides the axial movement of rod 16.

When the valve body is in the closed condition, the compound 1 is enclosed and confined within the compound vessel 12. Seal material 20 and an O-ring 21 seal the top part of the compound vessel 12 to create a vacuum therein, whereas the space above the seal material 20 is open to the atmosphere. The thin tube-like nozzle 22 is designed to eject the vapor of the compound 1 in a beam form. A heater in the form of a heating coil 23 encircles the vessel 12 to uniformly heat and vaporize the compound 1. Thermo couple 24 detects the temperature of vessel 12. A feed through connector 25 is connected to the heating coil 23 and thermo couple 24 and leads to a point outside the vacuum vessel for connection to a temperature controller (not shown). Insulator 26 insulates feed through connector 25 from a retention body 17. The overall vacuum vessel is sealed to the retention body 17 by an O-ring 28, and the nozzle 22 thus forms part of the inner part of the vacuum vessel 27.

Next, an explanation will be given of the embodiment of compound vapor ejection device shown in FIG. 1. The pressure within the vacuum vessel 27 is maintained at a value less than $1 \times 10^{-5}$ Torr. In this example, the compound 1 is phenanthrene. When the vessel 12 is heated to 80° C., the pressure inside of vessel 12 becomes approximately 0.16 Torr because of the formation of phenanthrene vapor. When the vapor body is opened at this point, the phenanthrene vapor is ejected through the nozzle 22 in the form of a thin beam. The size and the ejection amount of the vapor beam are determined by the diameter and the length of the nozzle 22, as described in J. Appl. Phys. 41 (1970) 2769–2776 of Olander and Kruger.

As stated above, when the compound vapor ejection device of embodiment 1 of the present invention is utilized, compound vapor at low vapor pressure is controllably ejected, and thus unnecessary areas are not polluted. Also, it is possible to control easily the ejection amount of the compound vapor. Furthermore, the ion source does not become polluted, and thus the life span of the ion source can be prolonged.

Embodiment 2

Figure 2:
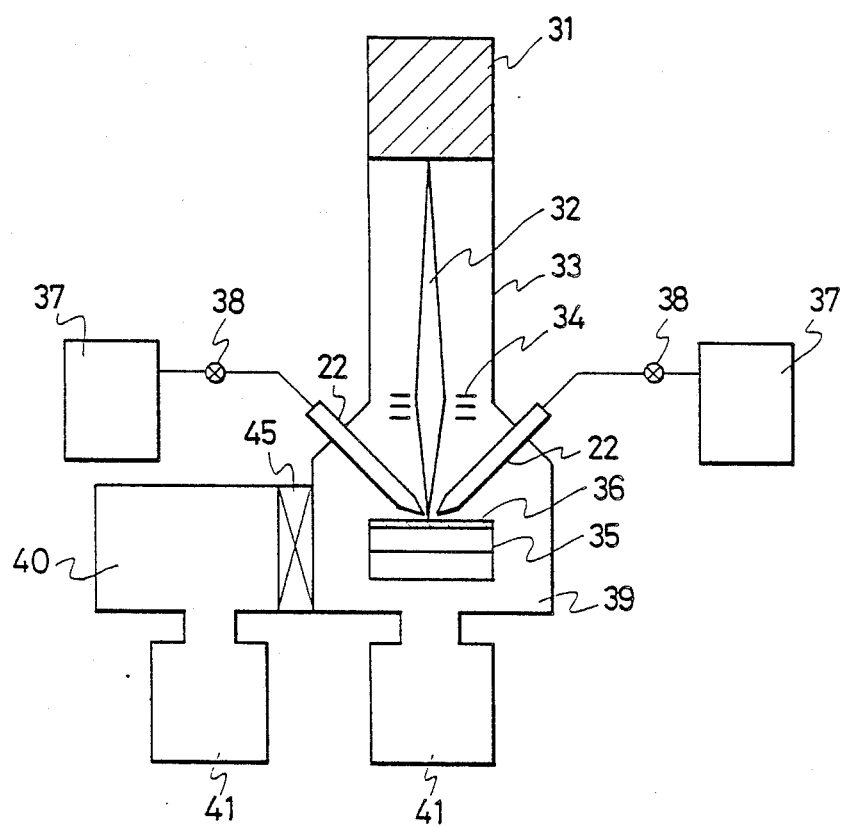
FIG. 2 is a general sectional diagram of other embodiments of the present invention.

FIG. 2 is a general sectional diagram of embodiment 2. An ion beam 32 ejected from an ion source 31 is directed to the surface of a sample 36, mounted on a sample stage 35, by a focusing lens 34 of an ion beam ejection series 33. The positions of defects in the sample 36 are detected in advance by a defect detecting device, and the sample 36 is moved to the desired target position by driving the sample stage 35. The form and the position of the defects can be examined by examining the surface of the mask by scanning the ion beam 32 in a known manner. The form of the defect is input into an ion beam control device, and the defect of the mask is repaired by scanning the ion beam.

When the defect is in the nature of an insufficiently formed film defect, it is repaired by forming a thin film by the reaction between the compound vapor and ion beam. This reaction occurs after the compound vapor from a compound vapor supply device 37, which is composed of a compound vessel 12 and heater 23 such as shown in FIG. 1, is sprayed by nozzle 22 through a valve body 38 to the ion beam target position. If desired, a plurality of nozzles 22 can be provided around the ion beam target position, or mounted oppositely with respect to the ion beam target position, and by using several nozzles 22, it is possible to spray the compound vapor simultaneously to the ion beam target position.

On the other hand, when the defect is in the nature of an unwanted film defect which must be removed, it is repaired by sputtering using the ion beam. During this kind of repair, the supply of the compound vapor is cut off by closing the valve body 38.

According to embodiment 2, as the vapor is ejected to a predetermined position by several nozzles, not only the flat portion of the mask pattern, but also the shade portions caused by the concave-convex shape of the pattern, can be reliably repaired. This embodiment also makes it possible to form a thin film with a small ejection amount of the compound vapor. Therefore, pollution inside the sample chamber is reduced, and the life span of the ion source is prolonged.

Embodiment 3

Figure 3:
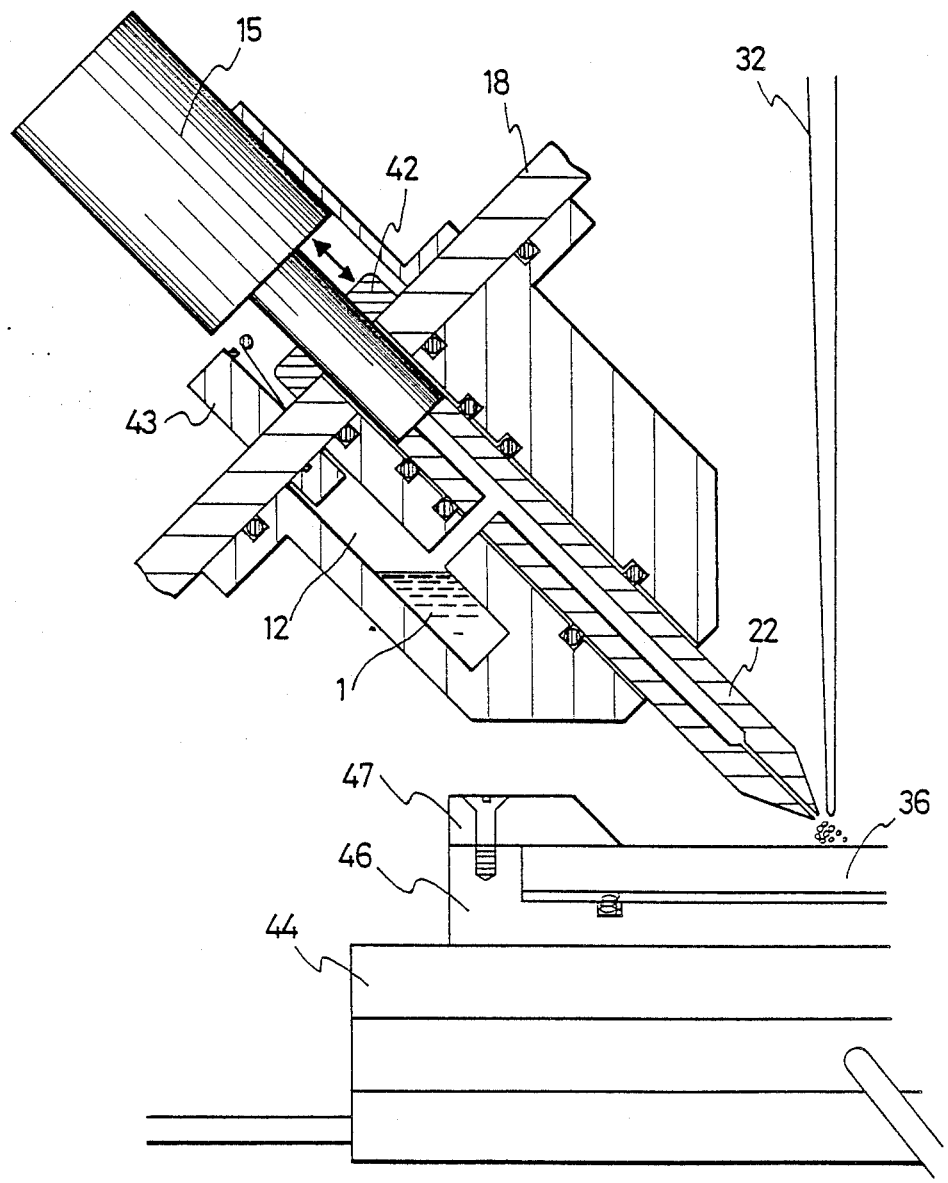
FIG. 3 is a main sectional diagram of one of the embodiments shown in FIG. 2.
Figure 4:
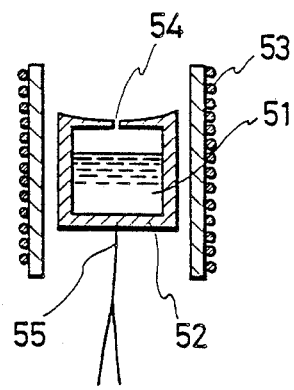
FIG. 4 is a sectional diagram showing the main part of a conventional compound vapor ejection device of the Knudsen cell type.
Figure 5:
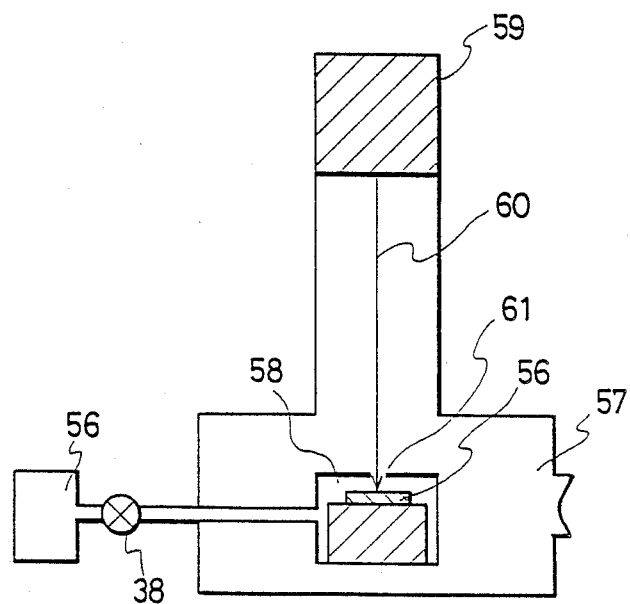
FIG. 5 is a general sectional diagram showing a conventional thin film forming device.

FIG. 2 is a general sectional diagram of embodiment 3, and FIG. 3 is a partial sectional diagram of embodiment 3.

In FIG. 3, the parts of the apparatus for forming a thin film on the insufficiently formed film of the mask pattern, and for removing an unwanted film, an omitted, as they have heretofore been explained in embodiment 2. Referring briefly to FIG. 2, the sample chamber 39 and sub-chamber 40 of the mask-repairing device of the present embodiment are evacuated by vacuum pumps 41. Sample 36 can be taken in and out of the sample chamber 39 by the opening and closing of a gate valve 45.

As the compound vapor ejection device emits compound vapor in the form of a beam from the thin nozzle 22, the total amount of the compound vapor can be reduced. FIG. 3 shows an example of the compound vapor ejection device. Nozzle 22 supplies compound vapor to the defect position on the sample 36. Compound vessel 12 heats and vaporizes the compound 1, and the compound vapor is led through and discharged from the nozzle 22. The tip portion of the nozzle 22 is connected to a cylinder 15. By driving the cylinder 15, the tip of the nozzle 22 of the compound vapor ejection device moves backwards and forwards. When the tip of the nozzle 22 moves forwards, a stopper 42 which is secured to the nozzle 22 strikes a mounting plate 18 thereby restricting the extent of forward displacement of the nozzle 22. The distance between the tip of nozzle 22 and the sample 36, at this point, is fixed at the most suitable distance, and the repairing of the mask defects can be achieved using a small amount of compound vapor.

When the nozzle moves backwards, after it has moved a predetermined amount, the communication between the compound vessel 12 and nozzle 22 is cut off, and the ejection of compound vapor is interrupted. At the same time, the stopper 42 actuates a micro switch 43 which produces a signal to initiate driving of the sample base 44 which, up to this point, has been locked in position. Also, the opening and closing of the gate valve 45 between the sample chamber 39 and the sub-sample chamber 40 is then carried out.

Therefore, according to this embodiment, the taking in and out of the sample 36 can be done only when the tip of the nozzle 22 has moved backwards. Thus accidents can be prevented. For example, conventionally, the nozzle 22 and such would likely be damaged by contact between the tip of nozzle 22 and the sample guard 47 whereas such damage is prevented by the present invention. Also, according to this embodiment, the tip of the nozzle 22 can be brought very close to the sample 36, so that the amount of the compound vapor ejected from the nozzle 22 can be limited to a minimum quantity. As a consequence, the load of the vacuum exhaust system and the pollution within the sample chamber 39 is reduced and the life span of the ion source is prolonged. In the explanation of FIG. 3, the compound vessel 12 is provided inside the sample chamber 39, but to enable easier replacement of the compound, the compound vessel 12 can be provided on the outside of sample chamber 39 as in FIG. 2.

UTILIZATION POSSIBILITY IN INDUSTRY

As stated above, with the present invention, in repairing defects such as insufficiently formed film and unwanted film in semiconductor manufacturing, the ejection amount of compound vapor, and its ON-OFF conditions can easily be controlled, the vapor ejection amount can be reduced, the operation of the repairing of mask defect is improved, and the pollution inside the sample chamber is prevented, and thus a mask-repairing device with an ion source having a long life span can be obtained. Also, as the contact between the nozzle tip and sample mask as such is prevented, the reliability of the device itself is improved.

Also, as it is possible to conduct the examination to locate the defect position of the mask and the repairing of the insufficient and unwanted film defects with one device, the repairing of the mask can be done accurately and speedily. Moreover, the mask-repairing device of the present invention can be utilized not only for repairing photo-masks and X-rays masks, but can also be utilized for connecting and cutting the wiring of super LSI.

We claim:

1. An apparatus for treating a sample comprising: means for irradiating a designated area of a sample with a focused ion beam; and means for producing and directing a vapor stream of compound onto the designated area of the sample, the means for producing and directing comprising a vessel for storing compound to be vaporized, heating means for heating the compound to vaporize the same inside the vessel to produce compound vapor, a nozzle in fluid communication with the inside of the vessel for receiving the compound vapor and directing the same in the form of a vapor stream onto the designated area of the sample, and valving means disposed along the fluid communication path between the vessel and nozzle and having a closed state for blocking the flow of compound vapor through the nozzle and an open state for permitting the flow of compound vapor through the nozzle, the valving means including a tubular member extending upwardly from the bottom of the vessel and terminating at its upper end in a valve seat in the upper region of the vessel and communication at its lower end with a nozzle, a movable valve member movable to a closed position wherein the valve member seats on the valve seat thereby defining the closed state and movable to an open position wherein the valve member is spaced from the valve seat so that compound vapor can flow from the vessel through the tubular member to the nozzle thereby defining the open state, and actuating means for actuating the valve member to the open and closed positions.

2. An apparatus according to claim 1 wherein the vessel has a generally tubular portion for storing therein the compound, and a generally downwardly tapering solid portion attached to the lower part of tubular portion, the nozzle being formed in the solid portion.

3. An apparatus according to claim 2 wherein the nozzle comprises means defining a thin nozzle bore extending through the downwardly tapering solid portion and terminating at the tip thereof, the nozzle bore communicating at its upper end with the tubular member.

4. An apparatus according to claim 3 wherein the heating means comprises a heating coil wound around the tubular and solid portions of the vessel and energizeable to vaporize the compound stored in the vessel.

5. An apparatus for treating a sample comprising: means for irradiating a designated area of a sample with a focused ion beam; and means for producing and directing a vapor stream of compound onto the designated area of the sample, the means for producing and directing comprising a vessel for storing compound to be vaporized, heating means for heating the compound to vaporize the same inside the vessel to produce compound vapor, a nozzle having a lengthwise extending main nozzle bore in fluid communication with the inside of the vessel for receiving the compound vapor and directing the same in the form of a vapor stream onto the designated area of the sample, means mounting the nozzle to undergo displacement in a forward direction to a forward position and in a rearward direction to a rearward position, actuating means for displacing the nozzle to the forward and rearward positions, and valving means disposed along the fluid communication path between the vessel and nozzle and having a closed state for blocking the flow of compound vapor through the nozzle and an open state for permitting the flow of compound vapor through the nozzle, the valving means comprising means within the nozzle defining a branch nozzle bore which communicates at one end with the main nozzle bore and which opens at the other end at the periphery of the nozzle, and means within a wall portion of the vessel defining a branch vessel bore which communicates at one end with the inside of the vessel and which opens at the other end at a location to communicate with the branch nozzle bore when the nozzle is displaced to the forward position thereby defining the open state of the valving means and to not communicate with the branch nozzle bore when the nozzle is displaced to the rearward position thereby defining the closed state of the valving means.

6. An apparatus for treating a sample comprising: means for irradiating a designated area of a sample with a focused ion beam; and means for producing and directing a vapor stream of compound onto the designated area of the sample, the means for producing and directing comprising a vessel for storing compound to be vaporized, heating means for heating the compound to vaporize the same inside the vessel to produce compound vapor, a nozzle in fluid communication with the inside of the vessel for receiving the compound vapor and directing the same in the form of a vapor stream onto the designated area of the sample, means mounting the nozzle to undergo displacement in a forward direction to a forward position and in a rearward direction to a rearward position, actuating means for displacing the nozzle to the forward and rearward positions, and valving means disposed along the fluid communication path between the vessel and nozzle and having a closed state for blocking the flow of compound vapor through the nozzle and an open state for permitting the flow of compound vapor through the nozzle, the valving means including a set of bores in the nozzle and vessel, the bores being positioned to communicate with one another when the nozzle is in the forward position to thereby permit the flow of compound vapor from the vessel through the bores and through the nozzle and to not communicate with one another when the nozzle is in the rearward position to thereby block the flow of compound vapor through the nozzle.

7. An apparatus according to claim 6; including a main sample chamber containing the means for irradiating the focused particle beam and the means for producing and directing the vapor stream of compound; another chamber adjacent to and in fluid communication with the main sample chamber; and valve means interposed between the two chambers and having a closed state for blocking communication between the two chambers and an open state for permitting communication between the two chambers.

8. An apparatus according to claim 7; wherein the valve means includes means responsive to displacement of the nozzle to the rearward position for placing the valve means in the open state.

9. An apparatus according to claim 8; wherein the valve means includes means responsive to displacement of the nozzle to the forward position for placing the valve means in the closed state.

10. An apparatus for treating a sample comprising: means defining a sample chamber for receiving a sample to be treated; irradiating means for irradiating a designated area of the sample in the sample chamber with a focused ion beam; means for producing a vapor of a compound effective, when irradiated with the focused ion beam at the surface of the sample, to form a film deposit on the sample; directing means for directing the compound vapor in the form of a vapor stream onto the designated area of the sample in the sample chamber while the sample is being irradiated with the focused ion beam, the directing means including a movable nozzle movable toward and away from the designated area of the sample, the nozzle having a nozzle tip for directing the compound vapor in the form of a vapor stream; and means for selectively preventing the compound vapor from being directed into the sample chamber while permitting the focused ion beam to be irradiated on the sample, the means for selectively preventing comprising means defining a first passage in fluid communication with the interior of the vessel to flow therethrough the compound vapor, and means defining a second passage in the nozzle in fluid communication with the nozzle tip, the second passage being positioned to communicate with the first passage when the nozzle moves toward the designated area of the sample to permit the flow of compound vapor through the nozzle tip and being positioned to not communicate with the first passage when the nozzle moves away from the designated area of the sample to prevent the flow of compound vapor through the nozzle tip.

11. An apparatus according to claim 10; including actuating means for actuating the nozzle toward and away from the designated area of the sample.

12. An apparatus according to claim 10; including another chamber in fluid communication with the sample chamber; and valving means disposed in the fluid communication path between the two chambers and having an open state for permitting fluid communication between the two chambers and a closed state for blocking fluid communication between the two chambers.

13. An apparatus according to claim 12; including means for placing the valving means in the closed state when the nozzle is moved to the forward position.

14. An apparatus according to claim 10; including in combination therewith a sample mounted in the sample chamber, the sample comprising a substrate having a designated area on which a pattern film is to be formed whereby the apparatus is used to form a pattern film on the substrate.

15. An apparatus according to claim 10; including in combination therewith a sample mounted in the sample chamber, the sample comprising a mask having a clear defect on a designated area thereof whereby the apparatus is used to repair the clear defect.

16. An apparatus according to claim 10; including in combination therewith a sample mounted in the sample chamber, the sample comprising a mask having an opaque defect on a designated area thereof whereby the apparatus is used to repair the opaque defect.

17. An apparatus according to claim 10; including in combination therewith a sample mounted in the sample chamber, the sample comprising an integrated circuit having wiring to be connected or cut on a designated area thereof whereby the apparatus is used to connect or cut the integrated circuit wiring.

18. An apparatus according to claim 10; wherein the directing means includes means for directing the compound vapor in the form of a vapor stream onto a designated localized area of the sample.

19. An apparatus according to claim 10; wherein the means for producing a vapor of a compound comprises a vessel at least partly surrounding the directing means for storing compound to be vaporized, and heating means for heating the compound to vaporize the same within the vessel to produce compound vapor.

* * * * *